United States Patent [19]

Rajivan

[11] Patent Number: 5,541,536
[45] Date of Patent: Jul. 30, 1996

[54] RUBBERBAND LOGIC

[75] Inventor: Sathyanandan Rajivan, San Jose, Calif.

[73] Assignee: Sun Microsystems, Inc., Mountain View, Calif.

[21] Appl. No.: 448,886

[22] Filed: May 24, 1995

Related U.S. Application Data

[63] Continuation-in-part of Ser. No. 397,419, Mar. 1, 1995.

[51] Int. Cl.[6] .................................................. H03K 19/096
[52] U.S. Cl. .................................................. 326/98; 326/97
[58] Field of Search ........................... 326/93, 95, 96–98, 326/121

[56] References Cited

U.S. PATENT DOCUMENTS

| | | | |
|---|---|---|---|
| 4,570,084 | 2/1986 | Griffin et al. | 307/452 |
| 4,780,626 | 10/1988 | Guerin et al. | 307/448 |
| 4,827,160 | 5/1989 | Okano | 307/443 |
| 4,831,285 | 5/1989 | Gaiser | 307/465 |
| 4,899,066 | 2/1990 | Aikawa et al. | 307/45.2 |
| 4,985,643 | 1/1991 | Proebsting | 307/443 |
| 5,089,726 | 2/1992 | Chappell et al. | 307/530 |
| 5,144,163 | 9/1992 | Matsuzawa et al. | 326/98 X |
| 5,208,490 | 5/1993 | Yetter | 307/452 |
| 5,333,119 | 7/1994 | Raatz et al. | 364/760 |
| 5,440,243 | 8/1995 | Lyon | 326/98 X |
| 5,453,708 | 9/1995 | Gupta et al. | 326/98 |
| 5,455,528 | 10/1995 | Partovi et al. | 326/98 |
| 5,479,107 | 12/1995 | Knauer | 326/98 X |
| 5,483,181 | 1/1996 | D'Souza | 326/95 X |

OTHER PUBLICATIONS

R. H. Krambeck et al., High–Speed Compact Circuits with CMOS, Jun. 1982, IEEE Journal of Solid–State Circuits, vol. SC–17, No. 3.

Hwang et al., "Ultrafast Compact 32–bit CMOS Adders in Multiple–Output Domino Logic", *IEEE JSSC*, vol. 24, No. 2, Apr. 1989.

*Primary Examiner*—David R. Hudspeth
*Attorney, Agent, or Firm*—Hickman Beyer & Weaver

[57] ABSTRACT

A circuit for evaluating logic inputs responsive to a reference clock, which circuit includes a first clock terminal for coupling with a first clock, the first clock being delayed from the reference clock by a first frequency dependent delay period. The circuit includes a second clock terminal for coupling with a second clock, the second clock being delayed from the reference clock by a second frequency dependent delay period. The inventive circuit further includes a first circuit stage, which includes a pulse generation circuit coupled to both the first clock terminal and the second clock terminal. In one embodiment, the first circuit stage further includes an output terminal, an evaluation device coupled to the output terminal and the pulse generation circuit. The first circuit stage also includes a precharge device coupled to the output terminal, a third clock terminal, and a first logic level, the third clock being delayed from the reference clock by a third frequency dependent delay period.

22 Claims, 7 Drawing Sheets

RUBBERBAND LOGIC

This is a Continuation-in-Part of application Ser. No. 08/397,419, entitled "Wave Propagation Logic" (Attorney Docket No. P688/SUN 1P016) and filed Mar. 1, 1995, which is incorporated herein by reference for all purposes.

BACKGROUND OF THE INVENTION

The present invention relates to apparatus and methods for an improved CMOS circuit. More particularly, the present invention relates to a new type of CMOS circuits that advantageously precharges its output nodes and evaluates its logic inputs using precharge and evaluate pulses that are delayed from one another in a frequency dependent manner.

In a CMOS dynamic logic circuit, an output node is typically precharged using a precharge clock during the circuit's precharge cycle. After precharging, logic inputs into the logic circuit are then evaluated using an evaluation clock during the circuit's evaluation cycle. To perform the above mentioned precharge and evaluation tasks, CMOS dynamic logic circuits typically employ two separate fixed delay clocks to precharge and evaluate their circuit stages. The evaluation and precharge clocks in dynamic logic circuits are considered fixed delay clock signals because they are delayed from one another by a fixed delay period.

To avoid a crowbar condition, i.e. the existence of an undesirable discharge path between $V_{dd}$ and $V_{ss}$ through the logic circuitry that may result in erroneous logic evaluations and a resultant increase in power consumption, it is important that the dynamic logic circuit terminates its precharge cycle well in advance of the evaluation cycle. In other words, it is important to make sure that the evaluation and precharge clocks are properly timed relative to one another and that there is an adequate safety margin between the times when precharge terminates and evaluation begins.

Generally speaking, the use of two clocks that are separated from one another by a fixed delay time period for precharging and evaluating a dynamic logic circuit is satisfactory if the delay time period is correctly determined during the design phase. To determine the appropriate delay for a given design, a circuit designer typically has to roughly calculate the fixed delay values in view of other circuit parameters for a given operating clock speed. The logic circuit is then simulated a number of times using different delay values. The optimal fixed delay time value for a given operating speed is that which yields the correct evaluation result while minimizing the required safety margin between the circuit's precharge and evaluation cycles. Once the correct delay time periods are determined, fixed delay elements, e.g. inverters, latches, and the like, may be fabricated to generate the appropriate precharge and evaluation clocks for that operating frequency.

However, the use of multiple fixed delay clocks for controlling evaluation and precharge has many drawbacks. For one, the determination of the optimal fixed delay values and safety margin values between clocks in order to guarantee correct evaluations without exacting an undue performance penalty is oftentimes a time consuming process. Further, these fixed delay time periods, being implemented via physical circuit elements, cannot be easily changed to accommodate changes in the circuit's operating speed or to optimize performance under certain conditions without undue design effort.

When the dynamic logic circuit is required to operate at a different clock frequency than the operating frequency at which fixed delay time periods were originally calculated, e.g. due to improvements in fabrication technologies or changes in system requirements, the fixed delay values have to be determined all over again to ensure that precharge and evaluation clocks are still properly timed relative to one another and that adequate safety margins still exist between the circuit's precharge and evaluation cycles. If it turns out that these delay values must be changed to ensure proper performance, new delay time periods typically must be calculated, the circuit re-simulated, and new elements physically fabricated in the logic circuit to create the proper fixed delay clocks although the functionality of logic circuit itself remains unchanged. In other words, if fixed delays are used to generate the precharge and evaluation clocks, a mere change in the logic circuit's operating speed may require a circuit designer to once again calculate new optimal delay values and physically change parts of the logic circuit.

Further, it is difficult to implement a circuit that is capable of evaluating multiple data cycles per system clock cycle using fixed delay clocks. The difficulty comes about as a result of the aforementioned inflexibility inherent in the generation and utilization of fixed delay clocks as well as the tendency of fixed delay clocks to be subject to process variations when fixed delay elements are fabricated.

Consequently, what is needed is an improved CMOS dynamic logic circuit that precharges its output nodes and evaluates its logic inputs using precharge and evaluate clocks that are delayed from one another in a frequency dependent manner. The improved logic circuit preferably ensures that the precharge cycle be terminated prior to the initiation of the evaluation cycle regardless of the operating frequency Instead of using fixed delay elements for generating their precharge and evaluation clock pulses, the improved logic circuit advantageously utilizes a plurality of clocks, which are themselves delayed from one another in a frequency dependent manner, in order to generate its precharge and evaluation clocks. Further, because the delay time periods and margins of the improved circuit are elastic with respect to the operating frequency, the precharge cycle is guaranteed to end prior to the initiation of the evaluation cycle regardless of the operating frequency, and the improved logic circuit advantageously needs a smaller safety margin between the precharge and the evaluation pulse. When the required margins are reduced, the improved circuit may be operated at a higher operating frequency, thereby improving performance. Further, the inventive apparatus and method facilitates a more efficient evaluation of multiple data cycles per clock cycle.

SUMMARY OF THE INVENTION

The invention relates to a circuit for evaluating logic inputs responsive to a reference clock, which includes a first clock terminal for coupling with a first clock, the first clock being delayed from the reference clock by a first frequency dependent delay period, and a second clock terminal for coupling with a second clock, the second clock being delayed from the reference clock by a second frequency dependent delay period. The inventive circuit further includes a first circuit stage, which includes a pulse generation circuit coupled to both the first clock terminal and the second clock terminal. In one embodiment, the first circuit stage further includes an output terminal, an evaluation device coupled to the output terminal and the pulse generation circuit, and a precharge device coupled to the output terminal, a third clock terminal, and a first logic level, the third clock being delayed from the reference clock by a third frequency dependent delay period.

In another embodiment, the invention relates to a method for improving performance in a logic circuit, which includes the step of providing a precharge pulse at a precharge node of the logic circuit. The inventive method further includes the steps providing a data pulse at a data input node of the logic circuit, the data pulse being delayed from the precharge pulse by a frequency dependent delay, and precharging an output node of the logic circuit with the precharge pulse. The inventive method also includes the step of evaluating a logic input to the logic circuit, using an evaluation device of the logic circuit, with the data pulse to ascertain a logic state of the output node.

In yet another embodiment, the invention relates to a method for improving performance in a circuit, which includes the step of providing a first clock terminal having a first clock, the first clock being delayed from a reference clock by a first frequency dependent delay period, and the step of providing a second clock terminal having a second clock, the second clock being delayed from a reference clock by a second frequency dependent delay period. In accordance to this embodiment, the inventive method further includes the step of providing a first circuit stage, which includes the steps of coupling a pulse generation circuit to the first clock terminal and the second clock terminal, providing an output terminal, coupling a first stage evaluation device to the output terminal and the pulse generation circuit, and coupling a first stage precharge device to a third clock terminal, the output terminal and a first logic level, the third clock terminal having a third clock, the third clock being delayed from a reference clock by a third frequency dependent delay period.

In yet another embodiment, the invention relates to a circuit, which includes a precharge node for providing a precharge pulse having a precharge pulse activation edge and a precharge pulse deactivation edge defining a precharge pulse width, the precharge pulse width changes responsive to a frequency of a reference clock. The inventive circuit further includes a data input node for providing a data pulse during a data valid cycle, the data pulse having a data pulse activation edge and a data pulse deactivation edge defining a data pulse width, the data pulse width changes responsive to a frequency of the reference clock, the data pulse activation edge being delayed from the precharge pulse deactivation edge by a frequency dependent delay. Furthermore, the inventive circuit includes a plurality of evaluation devices, a first one of the plurality of evaluation devices being coupled to the data input node, a second one of the plurality of the evaluation devices being coupled to a first logic level, an output node coupled to the precharge node and the first one of the plurality of evaluation devices, and a precharge device coupled to the precharge node, the output node, and a second logic level, the precharge device couples the output node to the second logic level responsive to the precharge pulse.

These and other features of the present invention will be presented in more detail in the following specification of the invention, the figures, and the appended claims.

DESCRIPTION OF THE PREFERRED EMBODIMENT

In the aforementioned commonly assigned, copending patent application entitled "Wave Propagation Logic" (Attorney Docket No. P688/SUN1P016), Ser. No. 08/397,419, filed Mar. 1, 1995 by myself, an improved dynamic logic circuit is disclosed and discussed in detail. In the aforementioned wave propagation logic circuit, an output node is typically precharged by a precharge pulse during the circuit's precharge cycle. After precharging, logic inputs into the logic circuit are then evaluated by an evaluation pulse during the circuit's evaluation cycle. In the present patent application, an improved dynamic logic circuit using multiple frequency dependent (rubberband) clocks for precharging and evaluating its nodes is disclosed.

Figure 1:
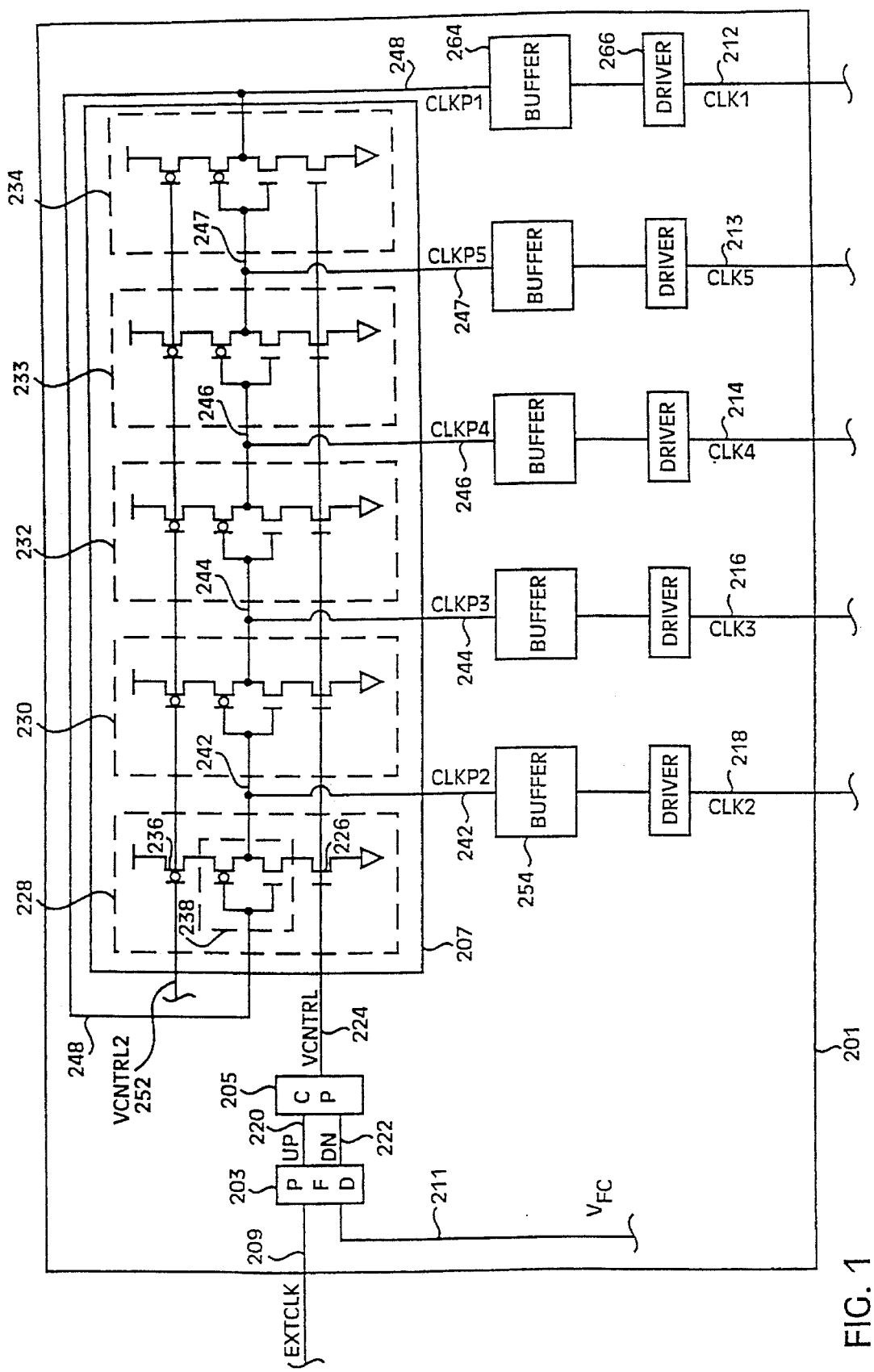
FIG. 1 shows in a simplified format a circuit used to generate multiple rubberband clocks.

FIG. 1 shows in a simplified format a circuit used to generate multiple rubberband clocks. Rubberband clocks are those whose frequencies and delays relative to one another stretch and shrink, i.e. increase and decrease, in response to the frequency of an external reference clock. It should be noted that the specific circuit shown in FIG. 1 is but one way to generate multiple rubberband clocks from an external reference clock and that other variations on the concept may be utilized to advantage without departing from the scope and spirit of the present invention.

Referring now to FIG. 1, there is shown a PLL circuit 201. PLL circuit 201 includes a phase frequency detector 203, typically disposed at the front end of the PLL circuit, a charge pump 205, and a voltage controlled oscillator 207. As is well known to those in the PLL art, PLL circuit 201 may include other circuit elements, e.g. regulator, filter, or the like, which are known and omitted from FIG. 1 for clarity of illustration.

PLL circuit 201 receives as its input an external reference clock signal EXTCLK (209), typically generated from a clock generating circuit, e.g. a crystal circuit of the types well known in the art. PLL circuit 201 outputs a plurality of rubberband clocks CLK1 (212), CLK2 (218), CLK3 (216), CLK4 (214) and CLK5 (213), all of which have substantially the same frequency, albeit phase shifted, relative to one another by a certain percentage of their period. When their frequencies change, rubberband clocks CLK1 (212), CLK2 (218), CLK3 (216), CLK4 (214), and CLK5 (213) remain phase shifted relative to one another. In this manner, these rubberband clocks are delayed from one another by a frequency dependent delay.

In operation, phase frequency detector 203 of PLL circuit 201 receives external reference clock signal EXTCLK (209) and compares the phase and frequency of external reference clock signal EXTCLK (209) with the frequency of an internal reference clock signal $V_{fc}$ 211. In one embodiment, internal reference clock signal $V_{fc}$ 211 is coupled to signal CLK1 (212) or some derivation, e.g. buffered version, of signal CLK1 (212). If external reference clock signal EXTCLK (209) is faster than internal reference clock signal $V_{fc}$ 211, phase frequency detector 203 generates an up signal 220 and outputs up signal 220 to charge pump 205. Conversely, if external reference clock signal EXTCLK (209) is slower than internal reference clock signal $V_{fc}$ 211, phase frequency detector 203 generates a down signal 222 and outputs that down signal 222 to charge pump 205.

Charge pump 205 receives either up signal 220 or down signal 222 and outputs in response thereto a controlled voltage VCNTRL (224). Controlled voltage VCNTRL (224) is high if charge pump 205 receives up signal 220. Conversely, controlled voltage VCNTRL (224) is low if charge pump 205 receives down signal 222. Controlled voltage VCNTRL (224), along with its dual signal VCNTRL2 (252), are then used to control a plurality of current starved inventor stages 228, 230, 232, 233, and 234 in a voltage controlled oscillator 207.

Note that FIG. 1 shows five current starved stages 228, 230, 232, 233, and 234 for generating the five rubberband clocks CLK1–CLK5. Typically, but not necessarily, a current starved stage, such as one of stages 228, 230, 232, 233, and 234, utilizes an inverter to modulate the delay through it. Current starved stage 228 controls the frequency dependent delay of a clock CLKP2 (242); current starved stage 230 controls the frequency dependent delay of a clock CLKP3 (244); current starved stage 232 controls the frequency dependent delay of a clock CLKP4 (246); current starved stage 233 controls the frequency dependent delay of a clock CLKP5 (247); and current starved stage 234 controls the frequency dependent delay of a clock CLKP1 (248). It should also be noted that while FIG. 1 shows only five current starved stages and five corresponding output rubberband clocks, it is possible to generate a greater or fewer number of rubberband clocks by adding or removing one or more current starved stages.

As shown in FIG. 1, within current starved stage 228, there is also shown a p-channel device 236 coupled in series with an inverter 238 and the aforementioned n-channel device 226. A current starved stage, such as stage 228 of FIG. 1, serves to change to delay at the stage output signal relative to the stage input signal in response to the amount of current flowing through the devices of the stage. For example, current starved stage 228 adjusts the delay of clock CLKP2 (242) relative to stage 228 input signal 248 in response to the amount of current flowing through p-channel device 236, inverter 238, and n-channel device 226.

P-channel device 236 is controlled by a controlled voltage VCNTRL2 (252) which is a dual signal of controlled voltage signal VCNTRL (224). If controlled voltage VCNTRL (224) is large, a relatively large amount of current will flow through the devices of current starved stage 228. Consequently, the output capacitances of current starved stage 228, which comprises the capacitances of a buffer associated with that stage, i.e. buffer 254, and the gate capacitances of the devices forming the inverter in the next current starved stage, i.e. stage 230, will be charged up quickly, thereby lessening the delay between the stage output signal, i.e. clock CLKP2 (242), and the stage input signal, i.e. clock CLKP1 (248). Clock CLKP2 (242), which is the output of current starved stage 228, serves as an input signal for current starved stage 230. Current starved stage 230 is also controlled by the two aforementioned controlled voltages, VCNTRL (224) and VCNTRL2 (252), to control a delay of stage 230 output signal, which is shown to be clock CLKP3 (244) in FIG. 1, relative to stage 230 input signal, which is shown to be clock signal CLKP2 (242).

In the same manner, clock CLKP3 (244) serves as an input to current starved stage 232 which, in response to controlled voltages VCNTRL (224) and VCNTRL2 (252), adjusts the delay of stage 232 output signal, which is shown to be clock CLKP4 (246) relative to stage 232 input signal. Similarly, clock CLKP4 (246) serves as an input to current starved stage 233 which, in response to controlled voltages VCNTRL (224) and VCNTRL2 (252), adjusts the delay of stage 233 output signal, which is shown to be clock CLKP5 (247) relative to stage 233 input signal. Likewise, clock CLKP5 (247) serves as an input to current starved stage 234 which, responsive to controlled voltages VCNTRL (224) and VCNTRL2 (252), controls the delay of stage 234 output signal, which is shown to be clock CLKP1 (248) in FIG. 1 relative to stage 234 input signal.

As is apparent from the foregoing, voltage controlled oscillator 207 receives a clock CLKP1 (248) and delays that signal by a frequency-dependent time period, the time period of the delay depends on controlled voltages VCNTRL (224) and VCNTRL2 (252), to produce one or more rubberband clocks. Through five current starved stages, a plurality of stage output signals, e.g. clocks 242, 244, 246, 247, and 248, each phase-shifted by 216 degrees (⅕ of 360 degrees plus 180 degrees due to the inverter used in this implementation of the current starved stage), are generated. In other words, each output signal is delayed from another by a frequency dependent amount.

The rubberband clocks, e.g. clocks 212, 213, 214, 216, and 218, are then generated from their respective stage output signals, e.g. clocks 242, 244, 246, 247, and 248, by a buffer/driver circuit of the types known in the art. Because rubberband clocks 212, 213, 214, 216, and 218 are generated by PLL circuit 201 from external reference clock signal (209), their frequencies also change depending on the frequency of external reference clock signal (209). In the example of FIG. 1, each rubberband clock remains phase-shifted from one another by 216 degrees regardless of the operating frequency.

Figure 2A:
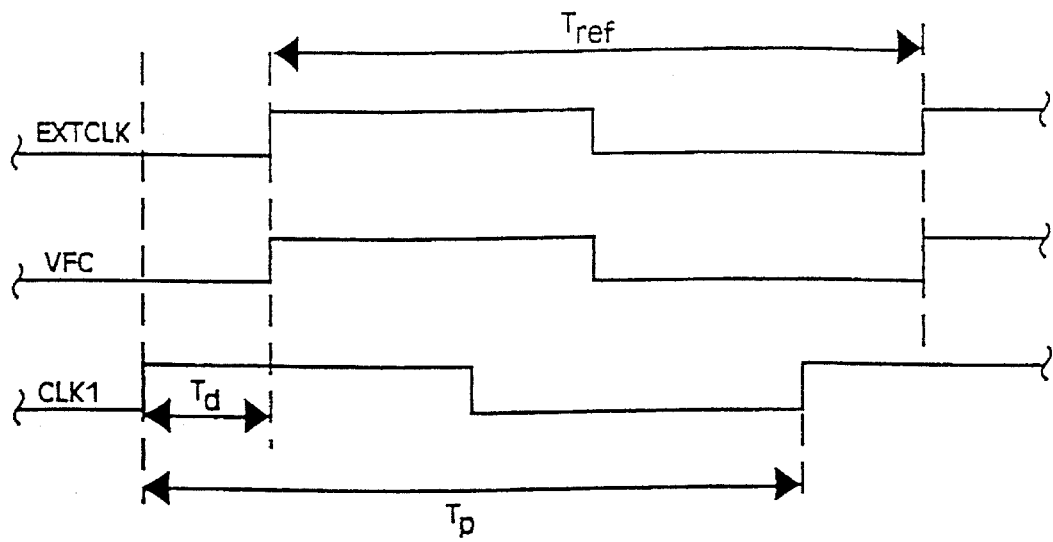
FIG. 2A shows in a simplified timing diagram the frequency dependent relationship between an external reference clock signal and a rubberband clock.

FIG. 2A shows in a simplified timing diagram the frequency dependent relationship between external reference clock signal (209) and rubberband clock CLK1 (212). As shown in FIG. 2A, clock CLK1 (212) has substantially the same frequency Fp (corresponding to a period $T_p$) as a frequency Fref (corresponding to a period Tref) of external reference clock signal EXTCLK (209). Further, clock CLK1 (212) leads external reference clock signal EXTCLK (209) by a time period, which is characterized by a period $T_d$ as shown in FIG. 2A. When $T_{ref}$ contracts or expands responsive to a change in the frequency of external reference clock signal EXTCLK (209), time period $T_p$ contracts and expands correspondingly. As is apparent, the frequency of clock CLK1 (212) expands and contracts when the frequency of external reference clock signal (209) is varied.

Figure 2B:
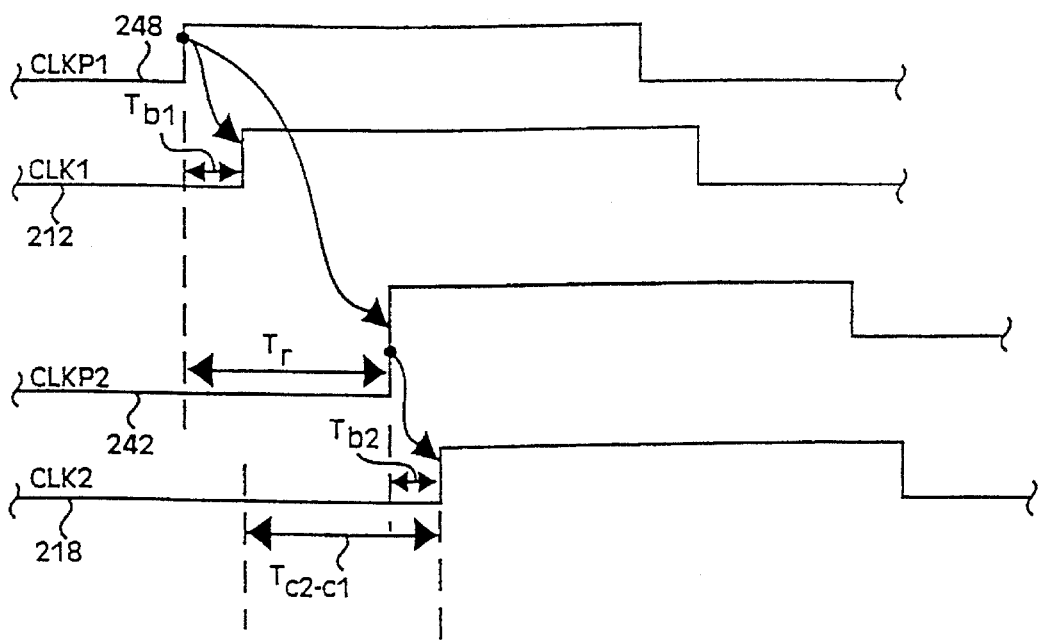
FIG. 2B shows in a simplified timing diagram the frequency dependent relationship between :rubberband clocks.

FIG. 2B shows in a simplified timing diagram (not to scale for simplicity of illustration) the frequency dependent relationship between clock CLKP1 (248), rubberband clock CLK1 (212), clock CLKP2 (242) and rubberband clock CLK2 (218). Referring now to FIG. 2B, rubberband CLK1 (212) is shown to be delayed from clock CLKP1 (248) by a delay time period $T_{b1}$. The delay time period $T_{b1}$ represents the delay associated with the buffer and driver circuits, e.g. elements 264 and 266 of FIG. 1, used to generate rubberband clock CLK1 (212) from clock CLKP1 (248). Typically, this delay is governed by the design of the buffer and driver circuits, is preferably kept to a small value, and does not vary responsive to the frequency of external reference clock signal (209). It should be noted that a buffer, such as buffer 264 of FIG. 1, may contain a single-to-differential converter to convert a single signal to a differential signal. For clarity sake, only the signals of interest, e.g. CLK2 (218), CLK3 (216), CLK4 (214), and CLK5 (213) are shown although it should be understood that differential signals are available.

FIG. 2B also shows clock CLKP2 (242) being delayed from clock CLKP1 (248) by a delay time period, which is characterized by period $T_r$ in FIG. 2B. The delay time period $T_r$ is controlled by current starved stage 228 of FIG. 1, which is in turn controlled by controlled voltages VCNTRL (224) and VCNTRL2 (252) as discussed earlier. In contrast to delay time period $T_{b1}$, delay time period $T_r$ varies depending on the frequency of external reference clock signal (209).

FIG. 2B also shows a rubberband clock CLK2 (218), shown to be delayed from clock CLKP2 (242) by a delay time period $T_{b2}$. Analogous to delay time period $T_{b1}$, delay time period $T_{b2}$ represents the delay associated with the buffer and driver circuits used to generate rubberband clock CLK2 (218) from clock CLKP2 (242). Delay time period $T_{b1}$ preferably equals delay time period $T_{b2}$. Because clock CLKP2 (242) is delayed from clock CLKP1 (248) by a frequency dependent delay time period, its respective rubberband clock, CLK2 (218), is also delayed from rubberband clock CLK1 (212), by substantially the same frequency dependent time period, i.e. delay time period $T_r$ shown in FIG. 2B. As the frequency of external reference clock signal (209) increases, the delay time period $T_{C2}-T_{C1}$ between these two rubberband clocks decreases. Conversely, the delay time period $T_{C2}-T_{C1}$ between these two rubberband clocks increases as the frequency of external reference clock signal (209) decreases.

Figure 3:
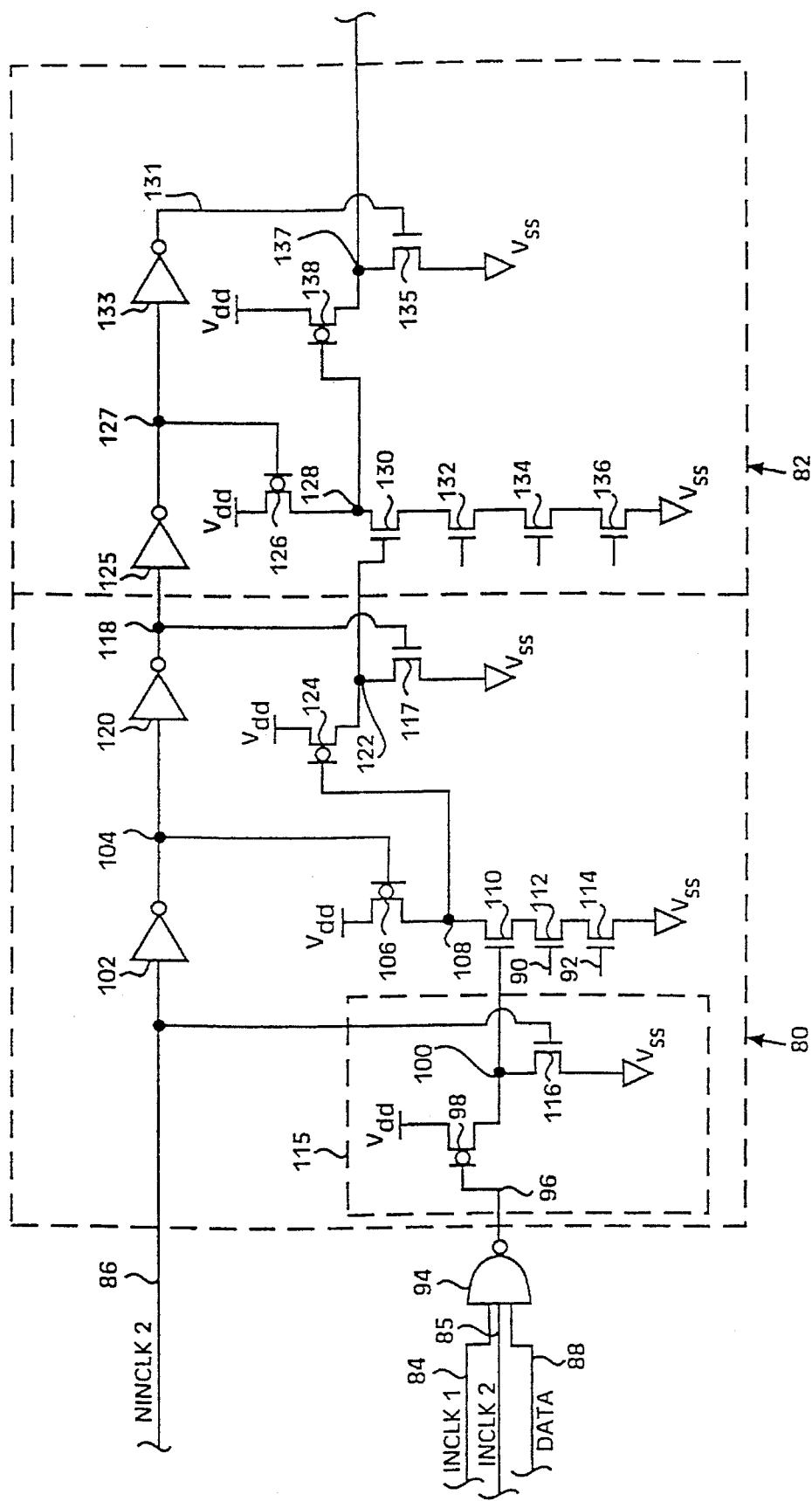
FIG. 3 shows in simplified circuit diagram a NAND-gate based rubberband logic circuit in accordance with one aspect of the present invention.

FIGS. 3 shows in simplified circuit diagram a NAND-gate based rubberband logic circuit in accordance with one aspect of the present invention. The circuit of FIG. 3 is NAND-gate based because it uses a NAND gating element to generate a pulsed data signal. However, other gating elements, such as NOR, XOR, AND, OR, or the like may be used to derive a gated signal without departing from the scope and spirit of the invention. The circuit of FIG. 3 includes two circuit stages 80 and 82. In each stage, there are preferably as many evaluation devices, e.g. devices 110, 112, and 114, as the number of logic inputs, e.g. signals 88, 90, and 92. In response to a precharge pulse on rubberband clock signals NINCLK 286, first circuit stage 80 and second circuit stage 82 serially precharge their respective terminals, e.g. nodes 100, 108, 122, 128, and 137 respectively. When rubberband clock signals INCLK1 84 and INCLK2 85, enter their evaluation phase and data signal 88 is valid, an evaluation data pulse is used to begin the evaluation of first circuit stage 80 to generate an output pulse. Thereafter, the output pulse from first circuit stage 80 is buffered and propagated to second circuit stage 82 to begin the evaluation of second circuit stage 82. In this manner, precharge and evaluation occur in a wave-like, serial manner from stage to stage of the robberband logic circuit.

Referring now to FIG. 3, when any of signals INCLK1 84, INCLK2 85, or data 88 is low, NAND output 96 of NAND gate 94 stays high. When clock signal INCLK2 85 is high, and data 88 is high (valid), the transition of clock signal INCLK1 84 from low to high causes NAND output 96 of NAND gate 94 to go low.

In one embodiment, when clock signal INCLK1 84 makes its transition from low to high, a clock signal NINCLK2 86, represented the complement of clock signal INCLK1 84, makes its transition from high to low substantially simultaneously.

The transition from high to low of clock signal NINCLK2 86 turns off an n-channel device 116, removing node 100 from ground. When NAND output 96 goes low, p-channel device 98 pulls node 100 high. Node 100 will stay high until pulled low by n-channel device 116 when NINCLK2 clock 86 switches from low to high at the start of the precharge phase. Note that p-channel device 98 and n-channel device 116 together function as a dynamic inverter in the circuit of FIG. 3. Although not required, dynamic inverters are preferable because of their advantages in circuit area and speed. As is apparent, NAND gate 94, p-channel device 98 and n-channel device 116 function together as a pulse generation circuit to furnish a pulsed data signal to the circuit of FIG. 3. When NINCLK2 clock 86 goes from high to low at the beginning of the evaluation phase, inverter 102 causes node 104 to go high. Node 104 is kept high until the next low-m-high transition of NINCLK2 clock 86 at the beginning of the precharge phase, causing node 104 to go from high to low. It should be noted that any one of evaluation devices 110, 112, or 114 may be used to control the evaluation of circuit stage 80, i.e., coupled to node 100.

The low node 104 turns on p-channel precharge device 106, connecting output terminal 108 to $V_{dd}$. During the period when node 100 is low, n-channel evaluation device 110 is turned off, disconnecting output terminal 108 from $V_{ss}$. Output terminal 108 is precharged high via p-channel precharge device 106 during this precharge period.

If data signal 88 is low during the evaluation period, NAND output 96 will be high by the operation of the NAND gate 94. When node 96 stays high because data signal 88 is low during the evaluation period, p-channel device 98 is not turned on, and node 100 stays low. When node 100 stays low due to a low data signal 88, n-channel evaluation device 110 does not conduct during the evaluation phase. Even if the inputs 90 and 92 to respective n-channel evaluation devices 112 and 114 are high, output terminal 108 stays at its precharged high during this evaluation phase.

Alternatively, if data signal 88 and both clock signals INCLK1 84 and INCLK2 85 had been high, node 96 would have been low during the evaluation period, causing node 100 to pull high via p-channel device 98. The high state of node 100 in turn causes n-channel evaluation device 110 to conduct, thereby pulling output terminal 108 to $V_{ss}$ (assuming inputs 90 and 92 are high at some point during the evaluation phase).

In any event, output terminal 108 is again pulled high when NINCLK2 clock 86 goes high at the beginning of the precharge phase. When NINCLK2 clock 86 goes high, node 104 goes low, turning on p-channel precharge device 106. For ease of illustration, the discussion of circuit stage 82 and the remaining portions of the circuit of FIG. 3 relates only to the situation when data signal 88 is high and inputs 90 and 92 to respective n-channel evaluation devices 112 and 114 are high. The behavior of the circuit of FIG. 3 when data signal 88 is low is readily deducible from the circuit diagram of FIG. 3 and from the discussions herein.

When node 104 goes from low to high at the beginning of the evaluation phase of the clock, node 118 goes from high to low due to the operation of inverter 120. Node 118 will stay low until node 104 changes from high to low, causing node 118 to go from low to high. Further, when output terminal 108 changes from high to low during evaluation (i.e., data signal 88 as well as both clocks signals INCLK1 84 and INCLK2 85 are high, and n-channel devices 112 and 114 are on during the evaluation phase), node 122 goes from low to high due to the operation of p-channel device 124. Node 122 will stay high until pulled low by the low-to-high transition of node 118 at the beginning of the precharge phase. This is because the high state of node 118 causes n-channel device 117 to conduct, connecting node 122 to $V_{ss}$ and pulling node 122 low. As is apparent, p-channel device 124 and n-channel device 117 perform the function of a dynamic inverter/buffer to switch the polarity of the signal on output terminal 108 at appropriate times.

On the other hand, the high-low transition of node 118 at the beginning of the evaluation phase causes node 127 to go high via the operation of inverter 125. Note that when node 127 was low and node 122 was low before the evaluation period, p-channel precharge device 126 connects output terminal 128 to $V_{dd}$ and disconnects output terminal 128 from $V_{ss}$, causing output terminal 128 to precharge in a manner similar to the precharging of output terminal 108.

As the low NINCLK2 clock 86 propagates through inverters 102, 120, 125 and reaches node 127, node 127 goes from low to high, turning off p-channel precharge device 126. Node 122 goes high, coupling output terminal 128 to $V_{ss}$ via n-channel devices 130, 132, 134, and 136 (assuming the inputs to the gates of n-channel devices 130, 132, 134, and 136 are all high some time during the evaluation phase of circuit stage 82). Further, when node 127 goes high, node 131 goes low via the operation of inverter 133. When node 131 goes low, n-channel device 135 is shut off, disconnecting node 137 from $V_{ss}$. When output terminal 128 goes low, p-channel device 138 causes node 137 to go high. Output terminal 128 will stay low until pulled high by p-channel precharge device 126 when node 127 goes low. When node 127 goes low, output terminal 128 is coupled to $V_{dd}$ via p-channel precharge device 126 and goes high.

Node 137 continues to stay high until pulled low by n-channel device 135 when node 131 goes high. The transition from high to low of node 137 represents the precharging to $V_{ss}$ Of the input to a circuit stage (not shown) subsequent to circuit stage 82.

Although the specific circuit chosen for illustration shows precharge being controlled by a rubberband clock NINCLK2 86 that is the complement of rubberband clock INCLK2, such is not a necessity. Because rubberband clocks NINCLK2 86 and INCLK2 85 are complements of one another in the circuit of FIG. 3, clock NINCLK2 86 is out of phase with clock INCLK2 85 by approximately 180 degrees. It is contemplated, however, that clock NINCLK2 86 may be another rubbberband clock generated from the PLL or a rubberband signal generated from one or more rubberband clocks. As long as clock NINCLK2 86 goes high after clock INCLK2 goes low, and goes low before clock INCLK1 goes high, a precharge pulse can be generated which does not create a race condition. From this discussion, it should be apparent to those of skill in the art to which this invention most nearly pertains that the use signals other than the complement of clock INCLK2 to control precharge provides additional flexibility with regard to timing For example, it is possible to derive the rising edge of clock NINCLK2 from a rubberband clock to guarantee that it always goes high after clock INCLK2 goes low. Similarly, it is possible to derive the falling edge of clock NINCLK2 from a rubberband clock so as to guarantee that it always goes low before clock INCLK1 84 goes high. Because rubberband clocks are used to derive such a NINCLK2 clock, race conditions can always be avoided regardless of the frequency of the external reference signal.

As is readily apparent from the foregoing, evaluation proceeds in a wave-like fashion from a first circuit stage 80 to a second circuit stage 82 and onto subsequent circuit stages of the rubberband logic circuit of the present invention. Likewise, the precharge phase proceeds in a wave-like fashion permitting evaluation and precharge to occur in a distributed, serial manner. An evaluation clock pulse, via either a NAND gate, a NOR gate, and the like, is used to evaluate the first circuit stage. The result of the evaluation of the first circuit stage propagates to subsequent circuit stages to serially evaluate those subsequent circuit stages. Precharge of the first circuit stage is also accomplished via a precharge pulse. That precharge pulse is permitted to propagate to subsequent circuit stages to serially precharge those subsequent circuit stages.

In the circuit of the present invention, the number of evaluation devices in a given stage equals the number of logic inputs in that stage. The reduction in the number of serial devices, compared to a comparable evaluation tree of a domino logic circuit, advantageously reduces the capacitive loading on the clock, the instantaneous peak current, and substantially increases the drive strength of the driving circuit stage.

Note that the circuit of FIG. 3 advantageously prevents the existence of a discharge path from $V_{dd}$ to $V_{ss}$, thereby conserving power and preventing an erroneous output. A discharge path exists if, for example, both p-channel precharge device 106 and n-channel evaluation device 110 of circuit stage 80 are permitted to turn on simultaneously. The circuit of FIG. 3 advantageously does not permit this condition to occur since precharge is guaranteed to terminate by its rubberband signal before another rubberband signal initiates evaluation.

Figure 4:
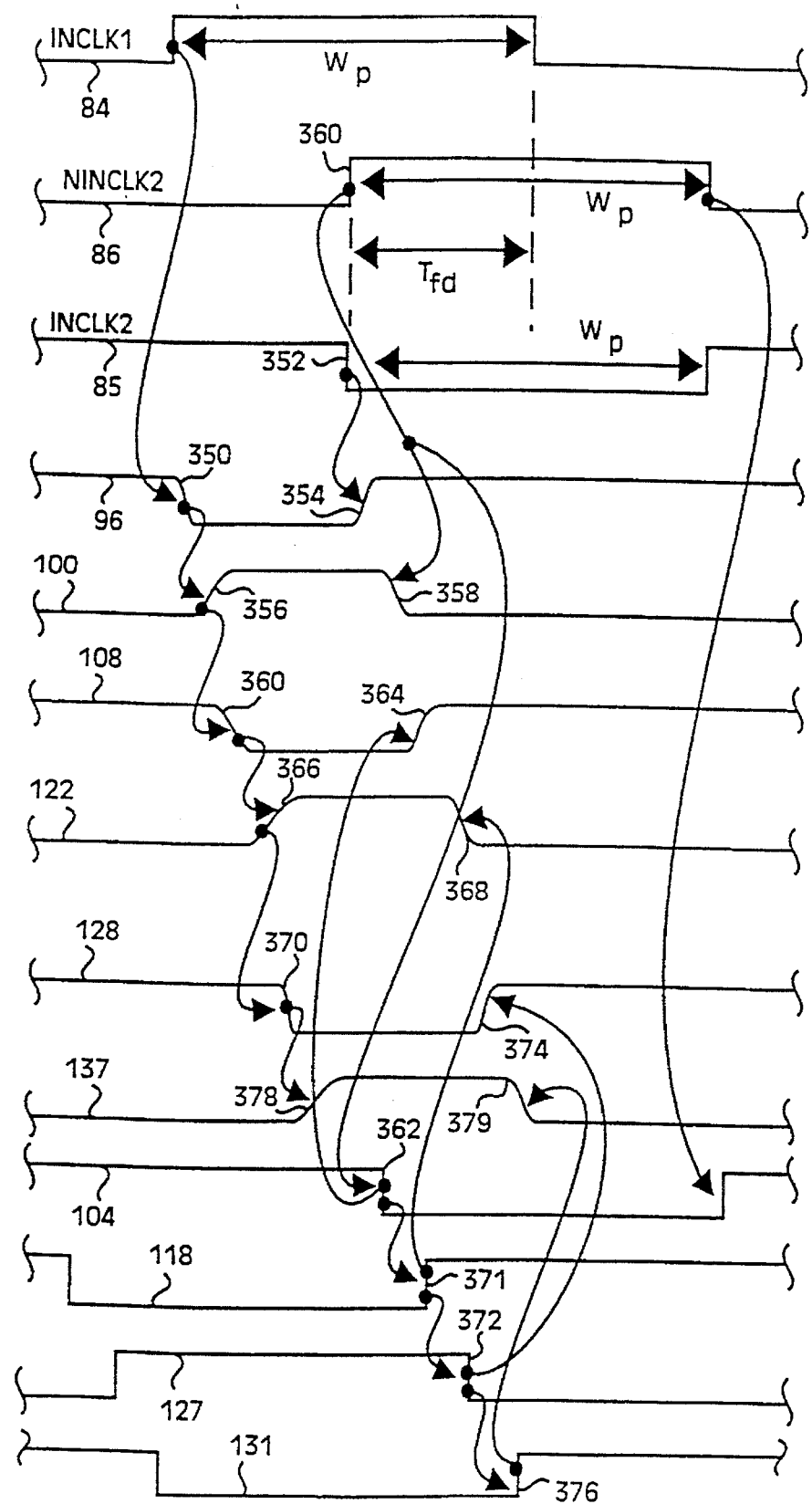
FIG. 4 shows in a simplified timing diagram the relationship between rubberband clocks and the logic states of certain nodes of the circuit of FIG. 3 during evaluation and precharge.

FIG. 4 shows in a simplified timing diagram the relationship between rubberband clock INCLK1 84, rubberband clock INCLK2 85, rubberband clock NINCLK2 86, and the logic states of certain nodes of the circuit of FIG. 3 during evaluation and precharge. Referring now to FIG. 4, there is shown a rubberband clock INCLK1 84, which has a pulse width Wp. Rubberband clock INCLK1 84 represents one of the signals inputted into NAND gate 94 of FIG. 3 for generating a pulsed data signal for evaluating first circuit stage 80. The second signal inputted into NAND gate 94 is rubberband clock INCLK2 85, also shown in FIG. 4 as having a pulse width $W_p$. These two signals have substantially the same pulse width $W_p$ because they are derived from the same reference clock signal. As is clearly shown in FIG. 4, clock INCLK1 84 is phase shifted from clock INCLK2 85, leading clock INCLK2 85 by a frequency dependent delay time period $T_{fd}$. When the frequency of the reference clock signal, e.g. signal 209 of FIG. 1, changes, this frequency dependent delay time period $T_{fd}$ correspondingly changes. There is also shown in FIG. 4 a rubberband clock NINCLK2 86, shown to be a mirror image of rubberband clock INCLK2 85 and preferably generated by the same circuit used for generating rubberband clocks INCLK1 84 and INCLK2 85.

NAND output 96 stays high when any of signals 84, 85, or 88 is low. When clock signal INCLK1 84 goes high, the transition from low-to-high of clock signal INCLK1 84, in combination with the already high clock signal INCLK2 85 (and assume there is valid data on conductor 88 of FIG. 3) causes NAND output 96 to go low at edge 350. NAND output 96 will stay low until clock signal INCLK2 85 goes low at edge 352, causing NAND output 96 to go high at edge 354.

The high-to-low transition of NAND output 96 at edge 350 causes node 100 to go high at edge 356 (via p-channel device 98 of FIG. 3). Node 100 is made to transition from high to low at edge 358 (via n-channel device 116 of FIG. 3) by the low- to-high transition of clock signal NINCLK2 86 at edge 360, which makes its transition substantially simultaneously as clock signal INCLK2 85 makes its transition from high- to-low. The pulse confined by edges 356 and 358 defines the evaluation data pulse used to control n-channel device 110 to evaluate stage 80.

The low-to-high transition of node 100 at edge 356 causes output node 108 (assume inputs 90 and 92 are high) to go low from its precharged high at edge 360. The low-to-high transition of clock NINCLK2 86 at edge 360 further causes node 104 to go from high to low (due to inverter 102), as shown at edge 362 in FIG. 4. When node 104 goes from high to low at edge 362, p-channel device 106 couples output node 108 to $V_{dd}$ to pull output node 108 high again at edge 364. Note that node 104 causes node 108 to go high at edge 364 after node 100 goes low at edge 358 because clock signal NINCLK2 86 must traverse inverter 102 and suffer the propagation delay associated therewith before turning on p-channel device 106. In contrast, n-channel device 116 is turned on substantially as soon as clock signal NINCLK2 86 goes high. Consequently output node 108 is advantageously disconnected from $V_{ss}$ prior to being precharge to $V_{dd}$.

The high-to-low transition of node 108 at edge 360 causes node 122 to pull high via p-channel device 124 at edge 366. The high-to-low transition of node 104 causes node 118 to go high at edge 371, pulling node 122 low at edge 368. The pulse defined by edges 366 and 368 represents the evaluation pulse used for evaluating stage 82 of FIG. 3. Note that unless output node 108 of stage 80 switches from high to low, node 122 never goes high to cause an evaluation. The low-to-high edge 366 of the evaluation pulse on conductor 122 causes node 128 to go low from its precharged high at edge 370 (again, assuming n-channel evaluation devices 132, 134, and 136 all conduct).

The high-to-low transition of node 104 traverses inverter 120, causing node 118 to transition from low-to-high, thereby causing n-channel device 117 to conduct to pull node 122 low, at edge 368, to end the evaluation pulse. When node 122 goes low again at the end of the evaluation pulse, output node 128 is effectively removed from $V_{ss}$. The same low-to-high edge 371 on node 118 travels through inverter 125 and causes node 127 to switch from high to low, at edge 372, to precharge output node 128 via p-channel precharge device 126. Consequently, node 128 goes from low to high, as shown at edge 374.

The high-to-low transition of output node 128 during evaluation causes output node 137 to go high at edge 378 due to p-channel device 138. This low-to-high transition of output node 137 may be used to initiate evaluation of a subsequent stage (not shown) of the rubberband logic circuit. The high-to-low transition of node 127 at edge 372 traverses inverter 133, causing node 131 to transition from low-to-high at edge 376. The low-to-high transition of node Y31 turns on device 135, causing output node 137 to go low at edge 379 to begin precharging output node 137 low.

As is apparent from the foregoing, the use of rubberband clocks in a dynamic logic circuits advantageously simplifies the task of optimizing circuit performance. In the prior art, delays and margins are precalculated and implemented in an unalterable manner. Altering the margin between the precharge clock and the evaluation clock in prior art circuits involves a nontrivial amount of resource and expenses. Consequently, designers working with prior art circuits are often very conservative with delays and margins and, do often err on the side of designing too much margin and delay into a circuit. When that happens, the resultant circuit does not operate optimally for a given system clock speed. In accordance with one aspect of the present invention, designers may estimate the optional delays and margins and implement a circuit using rubberband clocks to control precharge and evaluation. Once the circuit is fabricated, the designer may increase or decrease the reference clock, e.g., clock 209 of FIG. 1, to increase or decrease the margins and delays as necessary to optimize performance. Because of the rubberband nature of these clocks, precharge, and evaluate pulses are guaranteed to be phase shifted from one another to prevent a crowbar condition regardless of the speed at which the inventive circuit operates.

In some logic systems, e.g. microprocessors, two or more data cycles are provided for each clock cycle of a system clock. When multiple pieces of data can be processed for each system clock cycle, the processing power of a given logic circuit is in effect multiplied without having to increase the speed of the system clock. When there are multiple data valid cycles to evaluate for each system clock, timing issues pose a challenge for circuit designers of CMOS dynamic logic. As the frequencies of the precharge and evaluation clocks increase to process more data per system clock cycle, the precharge and evaluation pulses become shorter. When this happens, it is necessary to reduce the margins between pulses in order to evaluate a piece of data and precharge before it is time to evaluate the next piece of data.

The increase in the frequency of both the precharge and the evaluation clocks as well as the decrease in the available time for safety margins makes it imperative that the precharge and evaluation pulses be properly timed relative to one another. The use of multiple rubberband clocks facilitates this critical timing requirement by always ensuring that the precharge clock is phase shifted from the evaluation clock by a given percentage of their respective clock periods regardless of the operating frequency. Further, since both the precharge and evaluate clocks are derived from an external reference clock, the designer may increase the frequency of the external reference clock, thereby shrinking the two clocks to maximize performance. If more safety margin is needed, e.g. there is an overlap between precharge and evaluation, the frequency of the external reference clock may be turned down, thereby increasing the delays between clocks and their corresponding safety margins. Unlike prior art circuits in which the delay between clocks are fixed, the amount of margin between the precharge and evaluation cycles of the inventive circuit can be easily adjusted to obtain maximum performance.

Figure 6:
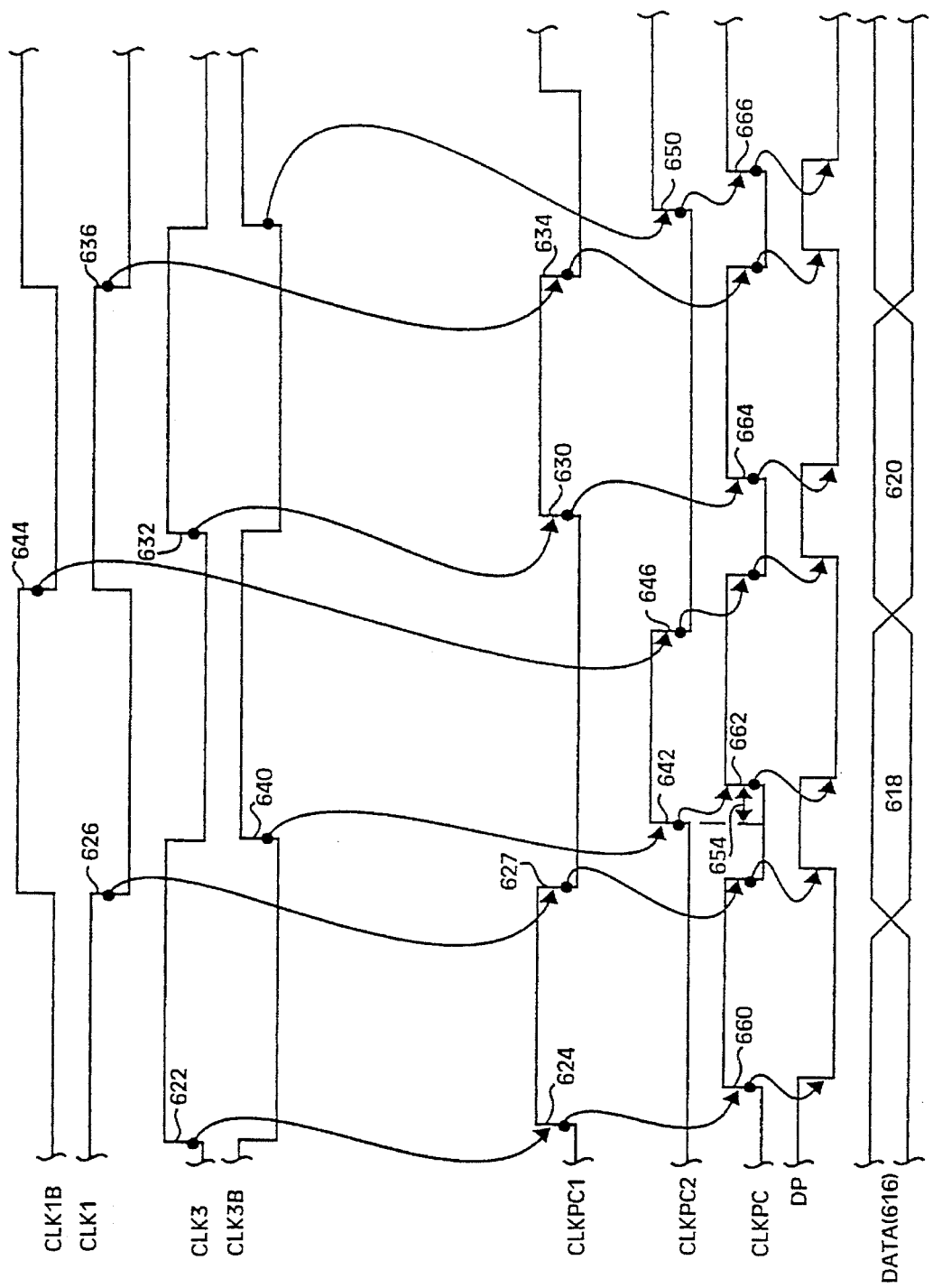
FIG. 6 shows in a simplified timing diagram format a plurality of rubberband clocks, and the precharge and evaluate signals that are generated therefrom.
Figure 7:
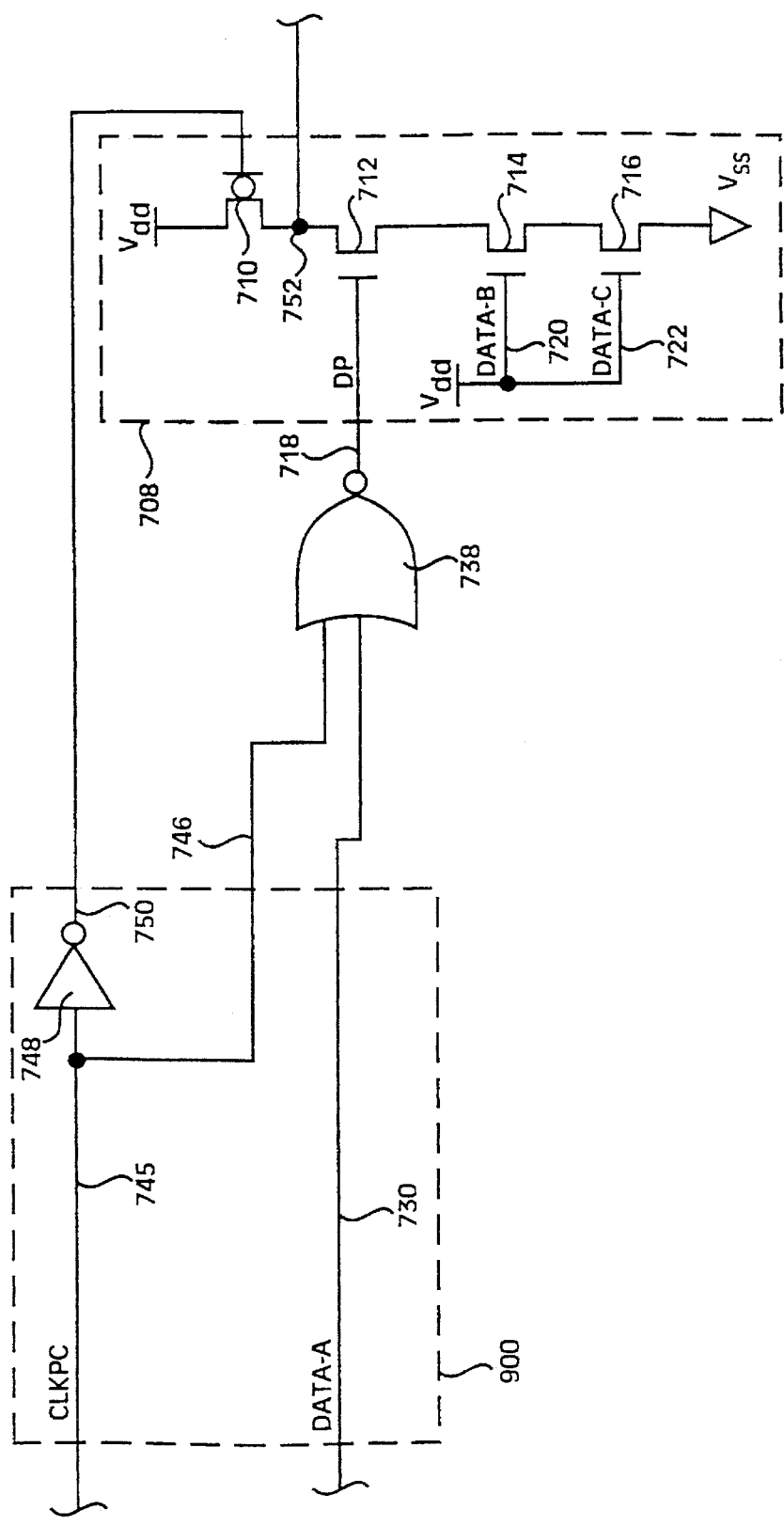
FIG. 7 shows in a simplified circuit diagram a rubberband logic circuit utilizing multiple rubberband clocks for evaluating two pieces of data for every clock cycle.
Figure 5:
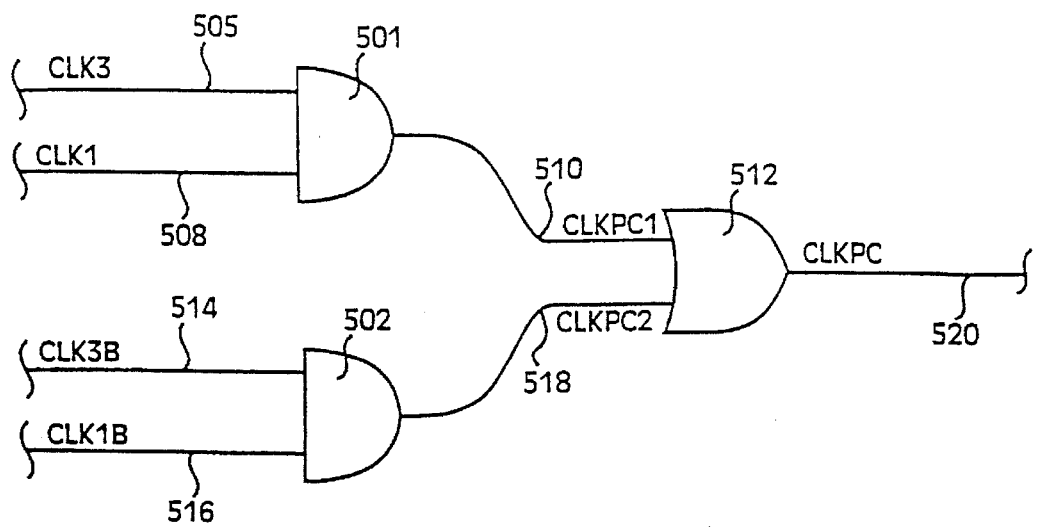
FIG. 5 shows in a simplified circuit diagram a circuit used to generate a precharge pulse for a rubberband logic circuit that is capable of evaluating two pieces of data per clock cycle.
Figure 8:
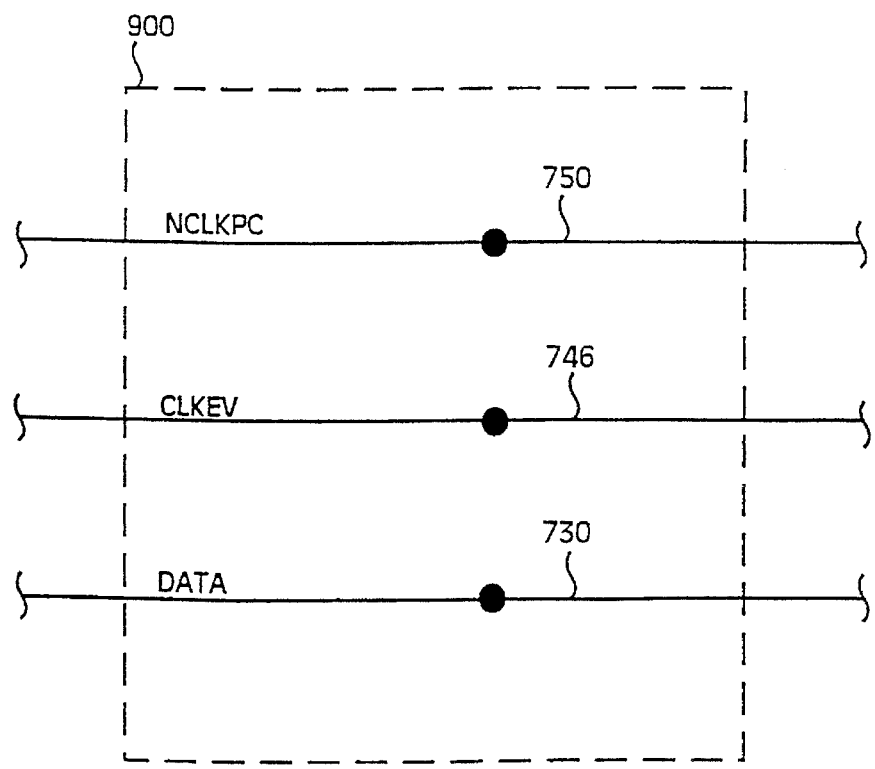
FIG. 8 shows an alternate embodiment of the circuit of FIG. 7 in which a rubberband signal is used for evaluation and another separate rubberband since it is used for precharge.

In FIGS. 5–8, a rubberband logic circuit for performing two data evaluations for each cycle of a reference clock is disclosed. FIG. 5 shows in a simplified circuit diagram a circuit used to generate a precharge pulse for a rubberband logic circuit that is capable of evaluating two pieces of data per clock cycle. FIG. 6 shows in a simplified timing diagram format a plurality of rubberband clocks, and the precharge and evaluate signals that are generated therefrom. FIG. 7 and 8 shows in a simplified circuit diagram the relevant portion of a representative rubberband logic circuit, including the precharge clock and the evaluate clock.

Referring now to FIG. 5, shown are two AND gates 501 and 502. 0R gate 501 receives as its inputs a rubberband clock CLK3 (505) and a rubberband clock CLK1 (508). AND gate 501 outputs a signal CLKPC1 (510), which is used an input to a subsequent OR gate 512. AND gate 502 receives as its inputs a rubberband clock CLK3B (514) and a rubberband clock CLK1B (516). From these inputs, AND gate 502 outputs a signal CLKPC2 (518), which is used an input to a 2-input OR gate 512. From inputs CLKPC1 (510) and CLKPC2 (518), OR gate 512 outputs a rubberband signal CLKPC (520) which is used to precharge a rubberband logic circuit twice every cycle of a system clock. As is apparent from FIG. 5, signal CLKPC (520) goes high when either 1) both clock CLK3 (505) and clock CLK1 (508) are high or 2) both clock CLK3B (514) and clock CLK1B (516) are high. Otherwise, signal CLKPC (520) stays low.

To further elaborate on the role of rubberband signal CLKPC (520) in a rubberband logic circuit that evaluate two pieces of data per system clock cycle, FIG. 6 shows in a simplified timing diagram format a plurality of rubberband clocks CLK1 and CLK3 and selective complementary signals of the aforementioned rubberband clock signals. Clocks CLK1 and CLK3 as well as their complimentary clock signals may be generated by, for example, a circuit similar to that shown in FIG. 1.

Referring now to FIG. 6, shown are clock signals CLK1 and CLK3. Clock signals CLK1 and CLK3 represent rubberband clocks which are phase shifted relative to one another, i.e. delayed from one another by a frequency dependent delay period. Clock CLK3 is the same clock CLK3 on conductor 505 of FIG. 5, and clock CLK1B is the same clock CLK1B on conductor 516 of FIG. 5. FIG. 6 also shows selected complimentary clocks of the above mentioned rubberband clocks. The selected complimentary rubberband clocks shown in FIG. 6 are: clock CLK1B and clock CLK3B. Complementary rubberband clock CLK3B is the same clock CLK3B on conductor 5 14 of FIG. 5, and clock CLK1 is the same clock CLK1 on conductor 508 of FIG. 5. To clarify, a complimentary rubberband clock, e.g. clock CLK1B, is a mirror image of its corresponding rubberband clock, e.g. clock CLK1. Also shown in FIG. 6 are signal CLKPC 1 and signal CLKPC2, which are signals shown on conductors 510 and 518 respectively of the circuit of FIG. 5.

FIG. 6 also shows rubberband signal CLKPC which is used to precharge the output node of the logic circuit of FIG. 7 twice every cycle of a system clock. As discussed in connection with FIG. 5, signal CLKPC, which is shown on conductor 52,0, is generated from signal CLKPC 1 and signal CLKPC2. As is apparent, since clocks CLKPC, CLKPC 1, and CLKPC2 are derived from rubberband clocks, each of clock CLKPC, CLKPC 1, and CLKPC2 is delayed from the reference clock, e.g., clock 209 of FIG. 1, by a frequency dependent time period. There is also shown in FIG. 6 a data signal 616, which is further shown to have two data valid cycles, e.g. data valid cycle 618 and data valid cycle 620, for every cycle of a system clock.

To further elaborate on the relationship between signal CLKPC 1 and the multiple rubberband clocks, consider rubberband clock CLK3 and rubberband clock CLK1. When rubberband clock CLK3 makes its transition from low to high at edge 622, rubberband clock CLK1 is already high. The high state of clocks CLK3 and CLK1 causes signal CLKPC1 to go high at edge 624 via AND gate 501 (shown in FIG. 5). Signal CLKPC1 stays high until rubberband clock CLK1 makes its transition from high to low at edge 626. Although rubberband clock CLK3 is still high when clock CLK1 makes its high-to-low transition at edge 626, signal CLKPC 1 nevertheless goes low at edge 627 via the operation of AND gate 501. The pulse on clock CLKPC 1, which is due to edges 622 and 626 respectively, are defined by edges 624 and 627 in FIG. 6. In the same manner, signal CLKPC 1 goes high again at rising edge 630 when rubberband clock CLK3 goes high at edge 632, and makes its transition from high to low at falling edge 634 when rubberband clock CLK1 goes low at edge 636.

Signal CLKPC2 is, on the other hand, controlled by complimentary rubberband clock CLK1B and complimentary rubberband clock CLK3B. When complimentary rubberband clock CLK3B makes its transition from low to high at edge 640, complimentary rubberband clock CLK1B is already high. Consequently, AND gate 502 causes signal CLKPC2 to go high at edge 642. When complimentary rubberband clock CLK1B goes low at edge 644, signal CLKPC2 goes low at edge 646 despite the fact that complimentary rubberband clock CLK3B is still high at that point in time: A subsequent rising edge of CLKPC2 clock pulse, characterized by edges 650, is generated in the same manner.

Precharge clock signal CLKPC, representing the sum of signal CLKPC1 and signal CLKPC2 is shown in FIG. 6. As is expected, each precharge pulse of signal CLKPC is slightly delayed from its respective constituent pulse, due to either signal CLKPC 1 or signal CLKPC2, because of the operation of OR gate 512. The delay associated with OR gate 512 is shown in FIG. 6 by the time period labeled 654.

Through the use of the circuit of FIG. 5 and multiple rubberband clocks CLK1, CLK1B, CLK3 and CLK3B, four precharge pulses, shown in FIG. 6 as pulses 660, 662, 664, and 666, or two precharge pulses per clock cycle, are generated as a result. As a consequence, a precharge pulse exists for each data valid cycle to furnish in a timely manner the precharge pulse to precharge a rubber band logic circuit. As is apparent from FIG. 6, when the reference clock speeds up and the times between edges 622, 626, 640, 644, 632, and 636 shrink, the frequency of precharge clock signal CLKPC increases while the size of precharge pulses 660, 662, 664, and 666 decrease. Conversely, when the reference clock slows down and the times between edges 622, 626, 640, 644, 632, and 636 expands, the frequency of precharge clock signal CLKPC decreases while the size of precharge pulses 660, 662, 664, and 666 increase.

FIG. 7 shows in a simplified circuit diagram a rubberband logic circuit utilizing multiple rubberband clocks for evaluating two pieces of data for every clock cycle. Referring now to FIG. 7, there is shown an evaluation tree 708 of a rubberband logic circuit stage, including p-channel precharge device 710 and n-channel evaluation devices 712, 714, and 716. The operation of the remaining portion of the rubberband logic circuit has been discussed extensively in connection with FIG. 3 and is not repeated here.

N-channel evaluation devices 712 is controlled by a data pulse DP on conductor 718. N-channel evaluation devices 714 and 716 are controlled by signals DATA-B and DATA-C on respective conductors 720 and 722. For ease of illustration, the gates of n-channel evaluation devices 714 and 716 are hard wired to $V_{dd}$ although it should be understood that the inputs to the gates of n-channel evaluation devices 714 and 716 represent logic inputs into the rubberband logic circuit of FIG. 7. It should be noted, however, that any one of devices 712, 714, and 716 may be used to control evaluation of the circuit of FIG. 7, i.e., coupled to conductor 718. Another logic input into the rubberband logic circuit of FIG. 7, DATA-A, is shown on conductor 730. DATA-A is coupled to a first input port of a 2-input NOR gate 738. The second input of NOR gate 738 is coupled to rubberband signal CLKPC by a conductor 746. As discussed earlier in connection with FIG. 6, signal CLKPC furnishes the precharge pulses to the rubberband logic circuit of FIG. 7. To actually control p-channel precharge device 710, signal CLKPC on conductor 745 is further inverted by an inverter 748 as shown in FIG. 7 to prevent the existence of a crowbar condition through device. The delay inherent in inverter 748 advantageously prevents unnecessary power consumption.

As is well known to those familiar with NOR gates, conductor 718 stays low if any of the inputs into NOR gate 738 is high. Conversely, if all inputs into NOR gate 738 are low, conductor 718 goes high, thereby turning on n-channel evaluation device 712. During precharge, signal CLKPC on conductor 745 is high. The high state of conductor 745, and concomitantly conductor 746, causes the output of NOR gate 738 to stay low, thereby turning off an n-channel device 712 and disconnecting an output node 752 of the rubberband logic circuit of FIG. 7 from $V_{ss}$. Simultaneously, conductor 750 goes low via the operation of inverter 748 to turn on p-channel precharge device 710 and to precharge output node 752. Note that p-channel device 710 can be made to turn on after n-channel device 712 is turned off by making the delay time for the high input-to-low output transition of inverter 748 slightly longer than the propagation delay of NOR gate 738. As will be discussed later, inverter 748 is preferably skewed such that the delay for the low input-to-high output transition of inverter 748 slightly shorter than the propagation delay of NOR gate 738. At the end of the precharge cycle, signal CLKPC on conductor 745 goes low, causing conductor 750 to go high via inverter 748, thereby turning off p-channel precharge device 710.

During the evaluation cycle when clock signal CLKPC is low, a high DATA-A on conductor 730 will cause the output of NOR gate 738 to stay low. In this case, n-channel evaluation device 712 does not turn on and output node 752 stays at its precharged high. In contrast, when DATA-A on conductor 730 is low, the output of NOR gate 738 goes high via the operation of NOR gate 738. Consequently, n-channel evaluation device 712 is turned on, pulling output node 752 low via evaluation devices 712, 714, and 716. Note that inverter 748 is skewed such that its delay for the low input-to-high output transition is slightly shorter than the propagation delay of NOR gate 738. Consequently, p-channel precharge device 710 is turned off, removing output node 752 from $V_{dd}$ before conductor 718 goes high. The evaluation cycle is ended when CLKPC goes high on conductor 745 at the beginning of the precharge cycle.

FIG. 8 shows an alternate embodiment of the circuit of FIG. 7 in which a rubberband signal CLKEV is used for evaluation and a separate rubberband signal NCLKPC is used for precharge. In the circuit of FIG. 8, conductor 730 is still coupled to DATA. However, conductor 746, which is coupled to one of the NOR gate 738 inputs, is coupled to a separate rubberband signal CLKEV in FIG. 8 instead of to signal CLKPC as shown in FIG. 7. FIG. 8 further shows conductor 750, which is used to control p-channel precharge device 710, coupled to a signal NCLKPC. Signal NCLKPC is the inverse of signal CLKPC of FIG. 7 and may be derived by applying an inverter to signal CLKPC, e.g. in the manner shown in FIG. 7. Conversely, signal NCLKPC may be derived directly from the generated plurality of rubberband clocks by a suitable circuit, e.g. a circuit similar to that shown in FIG. 5 with the exception that OR gate 512 is substituted by a NOR gate. To prevent a race condition, it is preferable that the evaluation pulses of rubberband signal NCLKEV do not overlap the precharge pulses of evaluation rubberband signal NCLKPC. Since rubberband clocks are used to generate both rubberband signals NCLKPC and CLKEV, one can guarantee that pulses on those signals never overlap simply by picking the appropriate rubberband clocks for the generation of those pulses. In this manner, even when the frequency of the external reference clock is changed, the relative relationship between the evaluation and precharge pulses on rubberband signals CLKEV and NCLKPC respectively still does not change. Furthermore, since the delays between clocks are no longer dependent on the construction of fixed, physical delay elements, the invention advantageously avoids process variation problems associated with the fabrication of the fixed, physical delay elements.

Although the foregoing invention has been described in some detail for purposes of clarity of understanding, it will be apparent that certain changes and modifications may be practiced within the scope of the appended claims. Given this disclosure, it will be apparent to those of ordinary skills in the art that combinations and substitutions may be made without departing from the scope and the spirit of the present invention. For example, although the specific embodiment refers to circuits for evaluating two data cycles per clock cycle, it should be apparent to those of skill in the art given this disclosure that circuits for evaluating a greater or fewer number of data cycles per clock cycle may be implemented. Further, although the inventive techniques and circuits have been described herein with reference to wave propagation circuits, it should be appreciated that the invention is not so limited and may be employed in many different types of CMOS circuits including, for example, NORA logic or domino logic. Consequently, the scope of the invention is not limited to the specific examples given herein but is set forth in the appended claims.

What is claimed is:

1. A circuit for evaluating logic inputs responsive to a reference clock, comprising:

a first clock terminal for coupling with a first clock, said first clock being delayed from said reference clock by a first frequency dependent delay period;

a second clock terminal for coupling with a second clock, said second clock being delayed from said reference clock by a second frequency dependent delay period; and a first circuit stage, comprising,
       a pulse generation circuit coupled to both said first clock terminal and said second clock terminal,
       an output terminal,
       an evaluation device coupled to said output terminal and said pulse generation circuit, and
       a precharge device coupled to said output terminal, a third clock and a first logic level, said third clock being delayed from said reference clock by a third frequency dependent delay period.

2. The circuit of claim 1 wherein said third frequency dependent delay period is substantially similar to said first frequency dependent delay period.

3. The circuit of claim 1 wherein said third frequency dependent delay period is longer than both said first frequency dependent delay period and said second frequency dependent delay period.

4. The circuit of claim 3 wherein said pulse generation circuit comprises:

a first inverter having an inverter output coupled to said evaluation device; and a gating element gate having a first gating element input coupled to a data terminal, a second gating element input coupled to said first clock terminal, a third gating element input coupled to said second clock terminal, and a gating element output coupled to an input of said first inverter.

5. The circuit of claim 4 wherein said first inverter further comprises:

a first p-channel device coupled to said first logic level, said evaluation device, and said gating element output; and a first n-channel device coupled to said first p-channel device, said evaluation device, said third clock terminal, and a second logic level.

6. The circuit of claim 5 wherein said first stage further comprising a second inverter having a second inverter input and a second inverter output, said second inverter input being coupled with said third clock terminal, said second inverter output being coupled to a control terminal of said precharge device.

7. The circuit of claim 6 further comprising a second circuit stage, said second circuit stage comprising:

a second stage output terminal, a second stage evaluation device coupled to said second stage output terminal, and a second stage precharge device coupled to said second stage output terminal and said first logic level; and a third inverter coupled in series between said output terminal of said first circuit stage and said second stage evaluation device.

8. The circuit of claim 7 wherein said pulse generation circuit generates a data pulse responsive to an evaluation cycle of both said first clock terminal and said second clock terminal.

9. The circuit of claim 1 wherein said second frequency dependent delay period is substantially the same as said first frequency dependent delay period.

10. The circuit of claim 1 wherein said pulse generation circuit comprises:

a first inverter having an inverter output coupled to said evaluation device; and a gating element gate having a first gating element input coupled to a data terminal, a second gating element input coupled to said first clock terminal, a third gating element input coupled to said second clock terminal, and a gating element output coupled to an input of said first inverter.

11. A method for improving performance in a logic circuit, comprising:

providing a precharge pulse at a precharge node of said logic circuit;

providing a data pulse at a data input node of said logic circuit, said data pulse being delayed from said precharge pulse by a frequency dependent delay period;

precharging an output node of said logic circuit with said precharge pulse; and evaluating a logic input to said logic circuit, using an evaluation device of said logic circuit, with said data pulse to derive a logic state of said output node.

12. The circuit of claim 11 wherein said data pulse and said precharge pulse are generated by at least two clocks, said at least two clocks represent clocks derived from a reference clock and are phase shifted relative to one another.

13. The circuit of claim 12 wherein said two clocks are generated from said reference clock using a PLL circuit.

14. A method for improving performance in a circuit, comprising:

providing a first clock terminal having a first clock, said first clock being delayed from a reference clock by a first frequency dependent delay period;

providing a second clock terminal having a second clock, said second clock being delayed from a reference clock by a second frequency dependent delay period;

providing a first circuit stage, comprising, coupling a pulse generation circuit to said first clock terminal and said second clock terminal, providing an output terminal, coupling a first stage evaluation device to said output terminal and said pulse generation circuit, and coupling a first stage precharge device to a third clock terminal, said output terminal and a first logic level, said third clock terminal having a third clock, said third clock being delayed from a reference clock by a third frequency dependent delay period.

15. The method of claim 14 wherein said step of providing said pulse generation circuit comprises:

providing a first inverter;

coupling an output terminal of said first inverter to said first stage evaluation device;

providing a gating element gate; and coupling a first gating element input of said gating element gate to a data terminal, a second gating element input of said gating element gate to said first clock terminal, a third gating element input of said gating element gate to said second clock terminal, and a gating element output of said gating element gate to an input of said first inverter.

16. The method of claim 15 wherein said step of providing said first inverter further comprises:

providing a first p-channel device;

coupling said first p-channel device to said first logic level, said first stage evaluation device, and said gating element output;

providing a first n-channel device and a fourth clock terminal having a fourth clock, said third clock being an inverted version of said fourth clock; and coupling said first n-channel device to said first p-channel device, said first stage evaluation device, said fourth clock terminal, and a second logic level.

17. The method of claim 16 further comprising the steps of:

providing a second circuit stage, comprising:

providing a second stage output terminal, coupling a second stage evaluation device to said second stage output terminal, and coupling a second stage precharge device to said second stage output terminal and said first logic level; and coupling a second inverter in series between said output terminal of said first circuit stage and said second stage evaluation device.

18. The method of claim 17 further comprising the step of providing a plurality of evaluation devices, each of said plurality of evaluation devices coupled to a logic input, a first one of said plurality of evaluation devices coupled to said second logic level and a second one of said plurality of evaluation devices coupled to said first stage evaluation device.

19. The method of claim 18 wherein the sum of said plurality of evaluation devices and said first stage evaluation device equals the number of logic inputs into said first circuit stage.

20. A circuit, comprising:

a precharge node for providing a precharge pulse having a precharge pulse activation edge and a precharge pulse deactivation edge defining a precharge pulse width, said precharge pulse width changes responsive to a frequency of a reference clock;

a data input node for providing a data pulse during a data valid cycle, said data pulse having a data pulse activation edge and a data pulse deactivation edge defining a data pulse width, said data pulse width changes responsive to a frequency of said reference clock, said data pulse activation edge being delayed from said precharge pulse deactivation edge by a frequency dependent delay;

a plurality of evaluation devices, a first one of said plurality of evaluation devices being coupled to said data input node, a second one of said plurality of said evaluation devices being coupled to a first logic level;

an output node coupled to said precharge node; and a precharge device coupled to said precharge node, said output node, and a second logic level, said precharge device couples said output node to said second logic level responsive to said precharge pulse.

21. The circuit of claim 20 wherein said data pulse activation edge and said precharge pulse deactivation edge are generated by at least two clocks, said at least two clocks represent clocks which are phase shifted relative to one another.

22. The circuit of claim 21 wherein said two clocks are generated from said reference clock using a PLL circuit.

* * * * *